(12) United States Patent
DiBattista et al.

(10) Patent No.: US 7,183,122 B2
(45) Date of Patent: Feb. 27, 2007

(54) PHYSICAL NANO-MACHINING WITH A SCANNING PROBE SYSTEM FOR INTEGRATED CIRCUIT MODIFICATION

(75) Inventors: Michael DiBattista, Santa Clara, CA (US); Richard H. Livengood, San Jose, CA (US); Elizabeth B. Varner, Palo Alto, CA (US); Randall C. White, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 408 days.

(21) Appl. No.: 10/848,925

(22) Filed: May 19, 2004

(65) Prior Publication Data

US 2005/0260775 A1 Nov. 24, 2005

(51) Int. Cl.
*H04L 21/00* (2006.01)
(52) U.S. Cl. .............................. 438/5; 438/10; 438/14; 257/E21.521
(58) Field of Classification Search .................... 438/5, 438/10, 13, 14, 15, 17
See application file for complete search history.

*Primary Examiner*—Scott B. Geyer
(74) *Attorney, Agent, or Firm*—Trop, Pruner & Hu, P.C.

(57) ABSTRACT

Nano-machining for circuit edits through the front side or backside of an integrated circuit may be performed using a scanning probe system. The system may create access holes with smaller dimensions and facilitate nano-machining endpoint detection in some embodiments.

18 Claims, 2 Drawing Sheets

PHYSICAL NANO-MACHINING WITH A SCANNING PROBE SYSTEM FOR INTEGRATED CIRCUIT MODIFICATION

BACKGROUND

The invention relates to making circuit edits or the physical modification of integrated circuits.

Circuit editing involves physically modifying integrated circuits to remove or add materials in order to alter the original design, enable additional circuit functionality, characterize the operation of the circuit, or correct the function of the integrated circuit. Circuit edits are performed during the initial stages of the integrated circuit's life cycle to understand or improve the product's performance. Circuit edits are often performed because they can quickly enable the circuit modification faster and less expensively when compared to the cost of new lithographic masks and the original wafer fabrication process.

Circuit edits are currently performed with laser and focused ion beam based tools. These tools are reaching the limitations of their capabilities to complete the circuit edit process due to geometry scaling, resolution limits, the change in the materials used to create integrated circuits, and nano-machining end-pointing difficulties.

Thus, there is a need for better ways to do circuit edits.

DETAILED DESCRIPTION

A scanning probe system can be based on atomic force or scanning tunneling microscopy to physically alter materials in specific locations and at the desired geometrical scale. The physical removal of material with the scanning probe system creates the ability to disconnect signals such as transistor inputs and outputs at the interconnect level, to remove the physical transistor structure, or to change the transistor structure to modify its electrical performance. The ability to add materials to the integrated circuit enables the scanning probe system to insulate signals with non-conductive materials and to transfer signal information to new locations such as the input to additional logical circuits in an integrated circuit with conductive materials.

A scanning probe system may, in some embodiments, provide additional capabilities such as analysis of material layers as they are removed and the non-selective removal of materials independent of composition or structure.

Figure 1:
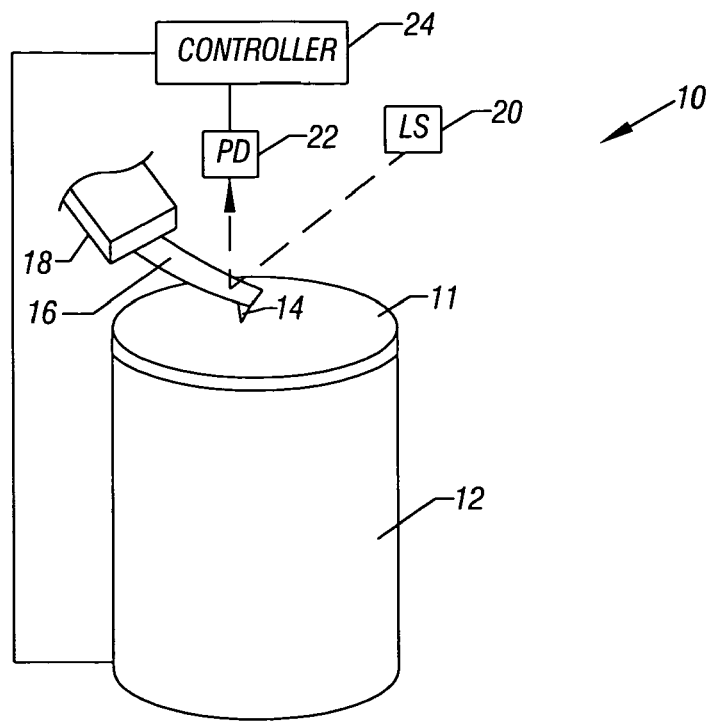
FIG. 1 is a partially schematic, front elevation view of one embodiment of the present invention.

Referring to FIG. 1, a scanning probe nano-machining system 10 may be based on an atomic force microscope system to remove the materials used to fabricate semiconductor integrated circuits. An integrated circuit can undergo the circuit edit process at wafer level or after the packaging step and can be accomplished from the device side of the wafer (front-side) or from the bulk substrate side (backside).

The tool 10 may include a tube scanner 12 that is capable of moving in any direction upon electrical command from a controller 24. An integrated circuit 11 may be positioned between a tip 14 and the tube scanner 12. The tip 14 is coupled to a cantilever support 18 through a cantilever 16. The cantilever 16 may spring bias the tip 14 against the integrated circuit 11.

A laser source 20 is shined on the cantilever 16 and its reflection is detected by a photodetector 22 coupled to the controller 24. Thus, the position of the tip 14 may be very accurately determined at any time. This position detection capability may be used to provide precise feedback with respect to the current location of the tip 14.

Figure 2:
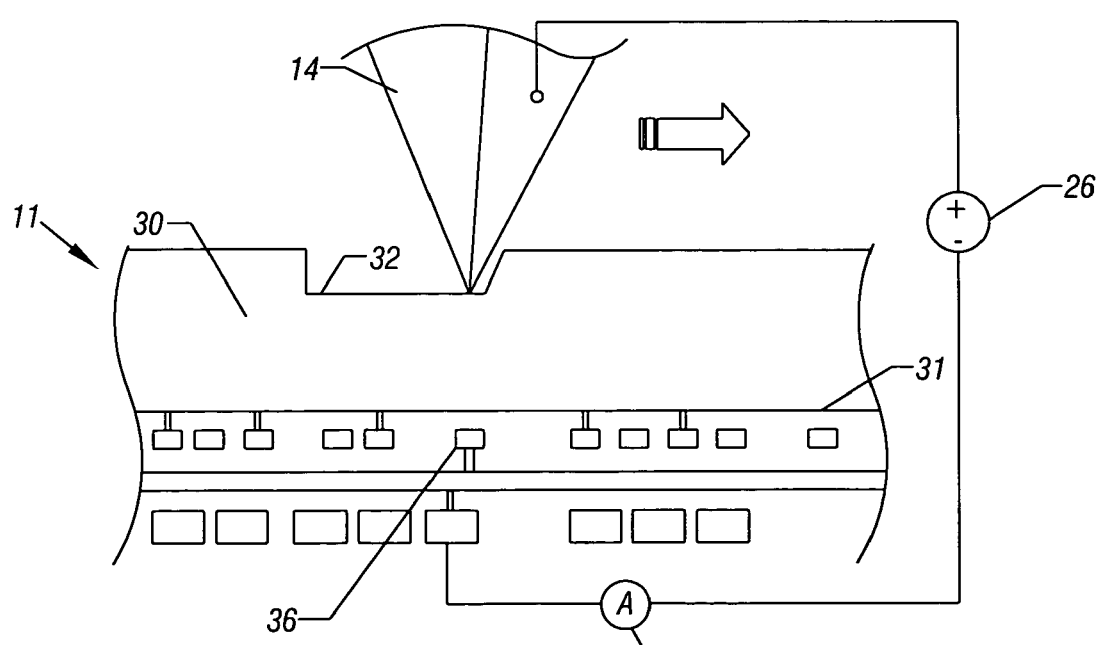
FIG. 2 is a partial, enlarged, cross-sectional view of the embodiment shown in FIG. 1 in operation in accordance with one embodiment of the present invention.

Referring to FIG. 2, the tip 14 may be positioned on the backside of an integrated circuit 11 to form an initial trench 32 in the silicon substrate 31. The tip 14, spring biased by the cantilever 16, effectively pushes atomic layers out of the way of the tip as the tip is scanned across the wafer backside as indicated by the arrow in FIG. 2. The tip 14 may be made of a relatively hard material such as diamond, silicon nitride, or silicon carbide, to prevent fracture and to allow nano-machining in accordance with some embodiments of the present invention.

The tip 14 shape may control the sidewall profile of the silicon node access hole 32. The tip 14 may be any shape, including the four sided pyramidal shape shown in FIG. 2. The debris from the machining operation may be removed from the work area by the tip 14 itself or through other means, such as carbon dioxide convection or supercritical carbon dioxide flow.

A circuit may be established between the tip 14 as one electrode, a voltage source 26, an ammeter 28, and a metallization 36 as a second electrode within the integrated circuit 11. Because of the conductivity of the silicon substrate 30, a completed circuit may generally be established during the machining operation.

Figure 3:
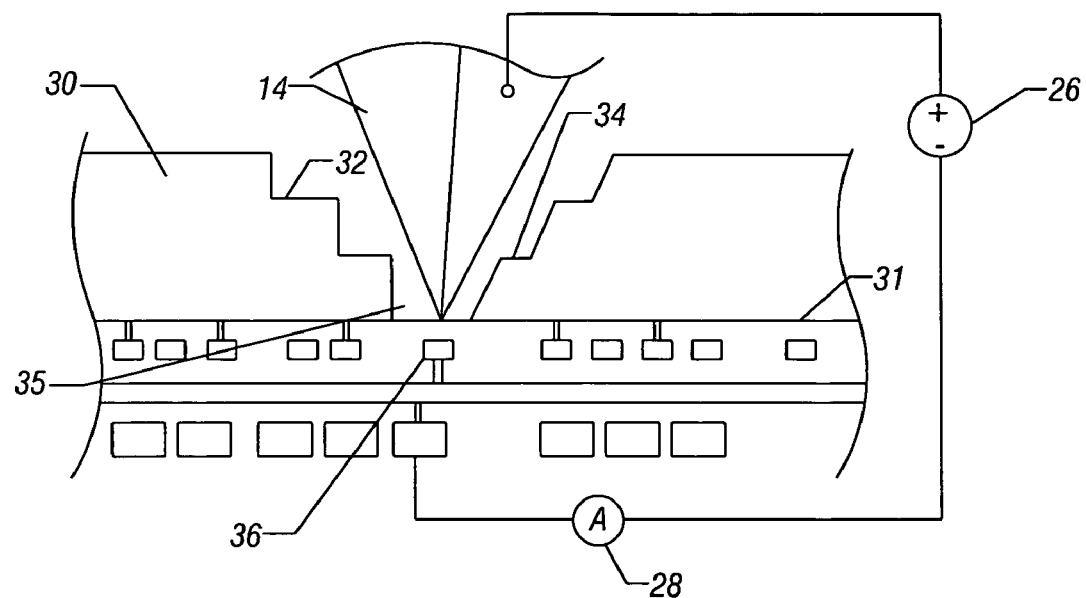
FIG. 3 is a partial, enlarged, cross-sectional view corresponding to FIG. 2 at a later stage in testing in accordance with one embodiment of the present invention.

Referring to FIG. 3, a second pass of the tool 10 may create a second hole 34 of smaller size than the hole 32 and, finally, a deeper hole 35 may be created on a third pass. The holes 32, 34, and 35 may be stair-stepped, with each progressive hole being smaller in horizontal extent than the one before. Of course, the number of passes to mill through the substrate 30 is subject to considerable variability. At the point shown in FIG. 3, in one embodiment, a shallow trench isolation structure 34 has been reached. This completes the node access hole in this embodiment.

The applied voltage from the voltage source 26 may experience an open circuit as the tip 14 exposes the insulator of the shallow trench isolation 34. This electrical measurement may be used as a qualitative end point detection in one embodiment of the present invention.

Figure 4:
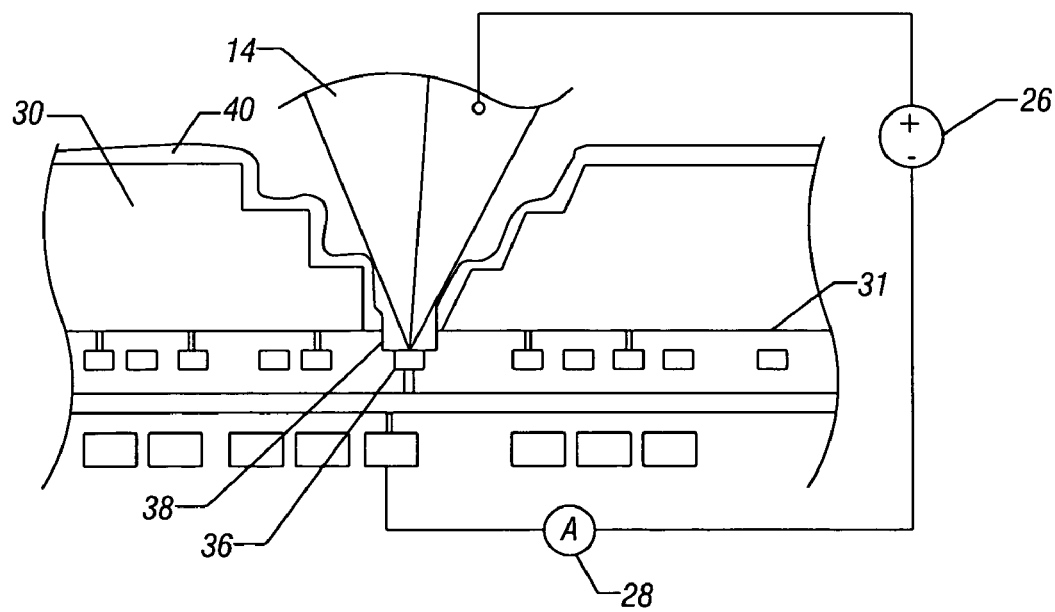
FIG. 4 is a partial, enlarged, cross-sectional view corresponding to FIG. 3 at a subsequent stage in accordance with one embodiment of the present invention.

Referring to FIG. 4, after one or more additional passes, the tip 14 may reach a metallization 36 through a hole 38. This completes the milling operation and results in the ability to create a smaller diameter node access hole and vias at the bottom of the shallow trench isolation and metal line compared to that possible with conventional techniques such as those created by focused ion beams.

In accordance with one embodiment of the present invention, the substrate 30 may be covered with a dielectric insulator 40 before the tip 14 is allowed to expose the metallization 36. The deposited insulator 40 protects the exposed layers from shorting when the tip 14 reaches a conductive layer such as the metallization 36. Once the metallization 36 is exposed, the tip 14 may be used to cut the metallization 36 or instead additional conductive material may be deposited and used as a routing material.

Additional end point detection may be made by determining the precise depth of the tip 14 using a laser beam from the laser source 20 and the detection of reflected laser made by the photodetector 22. Thus, very precise measurements may be made of the position of the tip 14 at any time.

In some embodiments of the present invention, node access holes can be made in the range of 1 to 10 microns thick with dimensions ranging from 225 square microns to 0.01 square microns, while removing dissimilar materials without smearing layers that would otherwise result in electrical shorting.

In some embodiments, a voltage may be applied to a circuit including the tip 14. When the tip 14 is removing dielectric material, the circuit is functionally open. As a metallization is exposed, the ammeter 28 indicates a short. The opposite situation can also be detected for interconnect cutting. The tip 14 can remove material until the ammeter 28 registers an open circuit, indicating that a metallization is completely cut. Other end point detection techniques may also be utilized.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   machining a hole on an integrated circuit with a scanning probe system; and
   performing a circuit edit through the hole formed by said system.

2. The method of claim 1 including machining said hole on the backside of the integrated circuit.

3. The method of claim 2 including machining a hole as a series of progressively smaller trenches through the backside of a silicon wafer.

4. The method of claim 3 including detecting an open circuit when the tool reaches an isolation region.

5. The method of claim 3 including detecting a short circuit when the tool reaches a metallization.

6. The method of claim 1 including providing an electrical connection between said integrated circuit and said tool.

7. The method of claim 1 including covering a portion of said hole with an insulating layer.

8. The method of claim 7 including covering said hole with an insulating layer before exposing a metallization.

9. The method of claim 1 including spring biasing a cantilever of an atomic force microscopy tool against an integrated circuit.

10. A method comprising:
    forming a first trench having sidewalls and a bottom in a semiconductor structure using a scanning probe system;
    forming a second trench through said bottom, said second trench having sidewalls that are spaced more closely than the sidewalls of said first trench; and
    using said trench to perform a circuit edit.

11. The method of claim 10 including biasing an atomic force microscopy tip against the semiconductor surface to move atomic layers to form said trenches.

12. The method of claim 11 providing an electrical connection between said semiconductor structure and said tip.

13. The method of claim 12 including detecting an open circuit when said tip reaches an isolation region in said semiconductor structure.

14. The method of claim 12 including detecting a short circuit once the tip reaches a metallization in said semiconductor structure.

15. The method of claim 11 including spring biasing said tip against said structure using a cantilever.

16. The method of claim 15 including determining the position of said tip by reflecting a laser beam from said cantilever.

17. The method of claim 10 including covering said first and second trenches with an insulating layer.

18. The method of claim 17 including covering said trenches with an insulating layer before exposing a metallization.

* * * * *